United States Patent
Yuzawa et al.

(10) Patent No.: US 8,878,365 B2
(45) Date of Patent: Nov. 4, 2014

(54) SEMICONDUCTOR DEVICE HAVING A CONDUCTIVE LAYER RELIABLY FORMED UNDER AN ELECTRODE PAD

(75) Inventors: Takeshi Yuzawa, Chino (JP); Masatoshi Tagaki, Suwa (JP)

(73) Assignee: Seiko Epson Corporation (JP)

( * ) Notice: Subject to any disclaimer, the term of this patent is extended or adjusted under 35 U.S.C. 154(b) by 145 days.

(21) Appl. No.: 13/273,613

(22) Filed: Oct. 14, 2011

(65) Prior Publication Data

US 2012/0032324 A1    Feb. 9, 2012

Related U.S. Application Data

(62) Division of application No. 11/449,796, filed on Jun. 8, 2006, now abandoned.

(30) Foreign Application Priority Data

Jul. 13, 2005   (JP) .................................. 2005-204521

(51) Int. Cl.
*H01L 23/48* (2006.01)
*H01L 23/52* (2006.01)
*H01L 21/768* (2006.01)
*H01L 23/528* (2006.01)
*H01L 23/00* (2006.01)

(52) U.S. Cl.
CPC .......... *H01L 24/13* (2013.01); *H01L 21/76838* (2013.01); *H01L 2924/01074* (2013.01); *H01L 2924/01033* (2013.01); *H01L 2924/01013* (2013.01); *H01L 2924/01078* (2013.01); *H01L 2224/13099* (2013.01); *H01L 2924/01006* (2013.01); *H01L 2924/01023* (2013.01); *H01L 2924/1005* (2013.01); *H01L 2924/01032* (2013.01); *H01L 2224/13147* (2013.01); *H01L 23/528* (2013.01); *H01L 2924/01079* (2013.01); *H01L 2924/0001* (2013.01); *H01L 24/11* (2013.01); *H01L 2924/01015* (2013.01); *H01L 2224/13144* (2013.01); *H01L 2224/13155* (2013.01); *H01L 2924/19043* (2013.01); *H01L 2924/01029* (2013.01); *H01L 2924/01082* (2013.01); *H01L 2924/01022* (2013.01)
USPC .......... 257/773; 257/775; 257/776; 257/756; 257/758; 257/E23.02; 257/E23.151

(58) Field of Classification Search
USPC .................. 257/773, 775, E23.151, E21.205, 257/E21.615, E21.635, E21.638, 776, 756, 257/758, E23.02
See application file for complete search history.

(56) References Cited

U.S. PATENT DOCUMENTS 5,027,188 A   6/1991   Owada et al.
5,084,752 A   1/1992   Satoh et al.
(Continued)

FOREIGN PATENT DOCUMENTS

CN   1269607   10/2000
CN   1519937   8/2004
(Continued)

*Primary Examiner* — Jesse Y Miyoshi
(74) *Attorney, Agent, or Firm* — Harness, Dickey & Pierce, P.L.C.

(57) ABSTRACT

A semiconductor device, including: a semiconductor layer; a first conductive layer formed above the semiconductor layer and having a first width; a second conductive layer connected to the first conductive layer and having a second width which is smaller than the first width; an interlayer dielectric formed above the first conductive layer and the second conductive layer; and an electrode pad formed above the interlayer dielectric. A connection section at which the first conductive layer and the second conductive layer are connected is disposed in a specific region positioned inward from a line extending vertically downward from an edge of the electrode pad; and a reinforcing section is provided at the connection section.

6 Claims, 8 Drawing Sheets

(56) References Cited

U.S. PATENT DOCUMENTS

Figure 1:
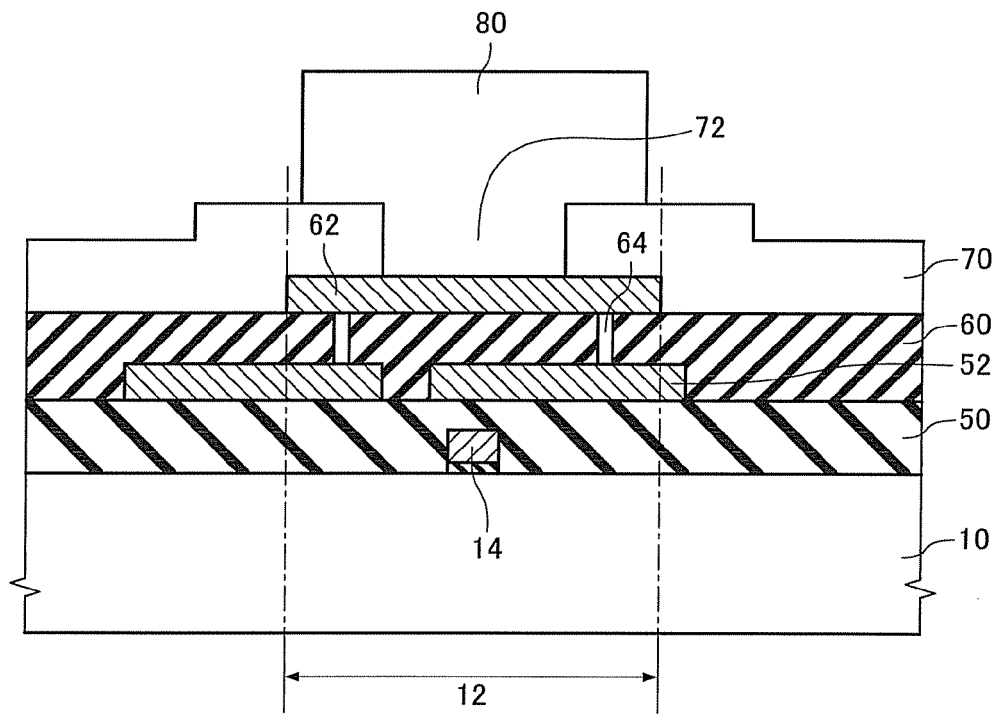

| | | | |
|---|---|---|---|
| 5,736,791 | A | 4/1998 | Fujiki et al. |
| 6,100,589 | A | 8/2000 | Tanaka |
| 6,130,485 | A | 10/2000 | Hirai |
| 6,268,642 | B1 | 7/2001 | Hsuan et al. |
| 6,407,345 | B1 | 6/2002 | Hirose et al. |
| 6,441,467 | B2 | 8/2002 | Toyosawa et al. |
| 6,465,895 | B1 | 10/2002 | Park et al. |
| 6,500,750 | B1 | 12/2002 | Shroff et al. |
| 6,538,326 | B2 | 3/2003 | Shimizu et al. |
| 6,650,002 | B1 | 11/2003 | Toyosawa et al. |
| 6,664,642 | B2 * | 12/2003 | Koubuchi et al. .............. 257/776 |
| 6,713,381 | B2 | 3/2004 | Barr et al. |
| 6,781,238 | B2 | 8/2004 | Nonaka |
| 6,818,936 | B2 | 11/2004 | Lin et al. |
| 6,864,562 | B1 | 3/2005 | Toyosawa et al. |
| 7,002,210 | B2 | 2/2006 | Taya |
| 7,008,850 | B2 | 3/2006 | Noda et al. |
| 7,064,417 | B2 | 6/2006 | Arai |
| 7,115,985 | B2 * | 10/2006 | Antol et al. .................... 257/700 |
| 7,271,046 | B2 | 9/2007 | Arai |
| 7,312,530 | B2 | 12/2007 | Hashimoto et al. |
| 2002/0000665 | A1 | 1/2002 | Barr et al. |
| 2002/0076851 | A1 | 6/2002 | Eden et al. |
| 2003/0036256 | A1 | 2/2003 | Efland et al. |
| 2004/0075113 | A1 | 4/2004 | Nakayama |
| 2004/0132236 | A1 | 7/2004 | Doris et al. |
| 2005/0042853 | A1 | 2/2005 | Gasner et al. |
| 2005/0112825 | A1 | 5/2005 | Kasuya |
| 2005/0258484 | A1 | 11/2005 | Itou |
| 2005/0285116 | A1 | 12/2005 | Wang |
| 2006/0017114 | A1 | 1/2006 | Chen et al. |
| 2006/0027880 | A1 | 2/2006 | Taya |
| 2006/0097406 | A1 | 5/2006 | Wu et al. |
| 2007/0007599 | A1 | 1/2007 | Shindo et al. |
| 2007/0007662 | A1 | 1/2007 | Shindo et al. |
| 2008/0284026 | A1 | 11/2008 | Hashimoto et al. |

FOREIGN PATENT DOCUMENTS

| | | |
|---|---|---|
| JP | 59-181041 | 10/1984 |
| JP | 02-024540 | 2/1990 |
| JP | 03-073438 | 7/1991 |
| JP | 2535529 | 2/1997 |
| JP | 11-008247 | 1/1999 |
| JP | 11-126790 | 5/1999 |
| JP | 11-145199 | 5/1999 |
| JP | 2000-058549 | 2/2000 |
| JP | 2001-110833 | 4/2001 |
| JP | 2001-284537 | 10/2001 |
| JP | 2002-319587 | 10/2002 |
| JP | 2003-179063 | 6/2003 |
| JP | 2003-297865 | 10/2003 |
| JP | 2003-347333 | 12/2003 |
| JP | 2004-207509 | 7/2004 |
| JP | 1601735 | 9/2004 |
| JP | 3608393 | 10/2004 |
| JP | 2004-363173 | 12/2004 |
| JP | 2004-363224 | 12/2004 |
| JP | 2005-050963 | 2/2005 |
| JP | 2005-108954 | 4/2005 |
| KR | 1997-0077390 | 12/1997 |
| KR | 1999-0052264 | 7/1999 |
| KR | 1999-0070614 | 9/1999 |
| KR | 10-0302536 | 7/2001 |
| KR | 2001-0061082 | 7/2001 |
| KR | 2002-0030258 | 4/2002 |
| KR | 10-0419813 | 2/2004 |
| KR | 2004-0032974 | 4/2004 |
| KR | 2007-0005498 | 1/2007 |
| KR | 2007-0005521 | 1/2007 |

* cited by examiner

US 8,878,365 B2

SEMICONDUCTOR DEVICE HAVING A CONDUCTIVE LAYER RELIABLY FORMED UNDER AN ELECTRODE PAD

This application is a divisional patent application of U.S. patent application Ser. No. 11/449,796 filed Jun. 8, 2006 which claims priority to Japanese Patent Application No. 2005-204521, filed on Jul. 13, 2005, all of which are hereby incorporated by reference in their entireties.

BACKGROUND OF THE INVENTION

The present invention relates to a semiconductor device.

In general, the characteristics of a semiconductor element (e.g. MIS transistor) and a conductive layer (e.g. interconnect) under a pad or a bump may be impaired due to stress during bonding or residual stress of the bump.

SUMMARY

According to a first aspect of the invention, there is provided a semiconductor device, comprising:
a semiconductor layer;
a first conductive layer formed above the semiconductor layer and having a first width;
a second conductive layer connected to the first conductive layer and having a second width which is smaller than the first width;
an interlayer dielectric formed above the first conductive layer and the second conductive layer; and
an electrode pad formed above the interlayer dielectric,
a connection section at which the first conductive layer and the second conductive layer are connected being disposed in a specific region positioned inward from a line extending vertically downward from an edge of the electrode pad; and
a reinforcing section being provided at the connection section.

According to a second aspect of the invention, there is provided a semiconductor device, comprising:
a semiconductor layer;
a first conductive layer formed above the semiconductor layer and having a first width;
a second conductive layer connected to the first conductive layer and having a second width which is smaller than the first width;
an interlayer dielectric formed above the first conductive layer and the second conductive layer; and
an electrode pad formed above the interlayer dielectric,
a connection section at which the first conductive layer and the second conductive layer are connected being disposed in a specific region positioned outward from a line extending vertically downward from an edge of at least part of the electrode pad; and
a reinforcing section being provided at the connection section.

According to a third aspect of the invention, there is provided a semiconductor device, comprising:
a semiconductor layer;
a first conductive layer formed above the semiconductor layer and having a first width;
a second conductive layer connected to the first conductive layer and having a second width which is smaller than the first width;
an interlayer dielectric formed above the first conductive layer and the second conductive layer;
an electrode pad formed above the interlayer dielectric,
a passivation layer formed above the electrode pad and having an opening which exposes at least part of the electrode pad; and
a bump formed in the opening,
a connection section at which the first conductive layer and the second conductive layer are connected being disposed in a specific region positioned inward from a line extending vertically downward from an edge of the bump; and
a reinforcing section being provided at the connection section.

According to a fourth aspect of the invention, there is provided a semiconductor device, comprising:
a semiconductor layer;
a first conductive layer formed above the semiconductor layer and having a first width;
a second conductive layer connected to the first conductive layer and having a second width which is smaller than the first width;
an interlayer dielectric formed above the first conductive layer and the second conductive layer;
an electrode pad formed above the interlayer dielectric,
a passivation layer formed above the electrode pad and having an opening which exposes at least part of the electrode pad; and
a bump formed in the opening,
a connection section at which the first conductive layer and the second conductive layer are connected being disposed in a specific region positioned inward and outward from a line extending vertically downward from an edge of at least part of the bump; and
a reinforcing section being provided at the connection section.

BRIEF DESCRIPTION OF THE SEVERAL V OF THE DRAWING

Figure 2:
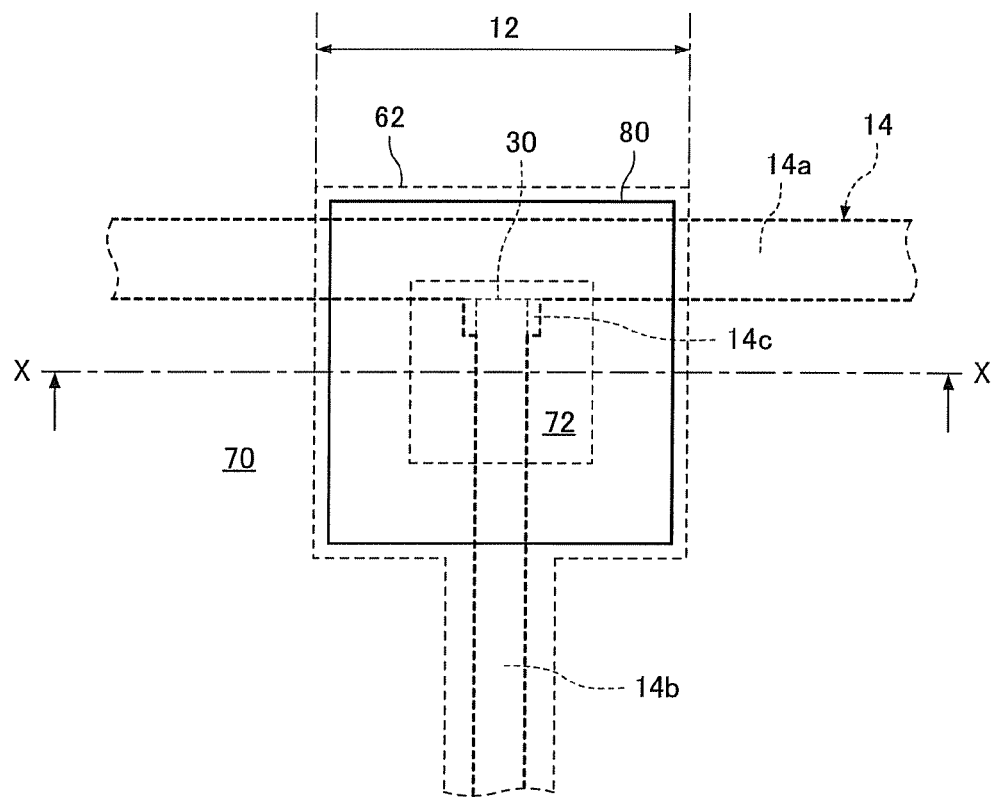
Figure 3:
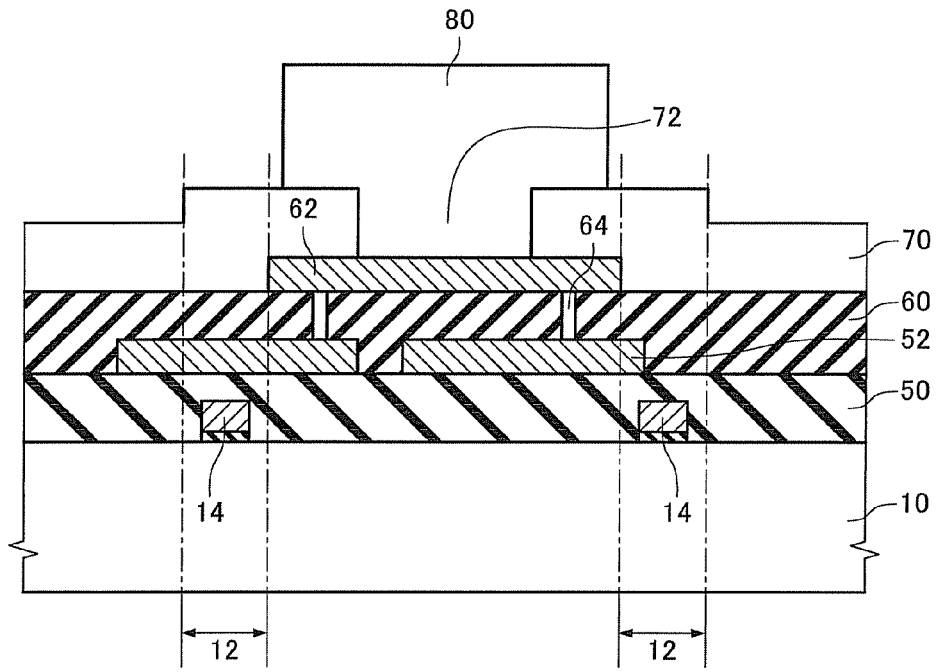
Figure 4:
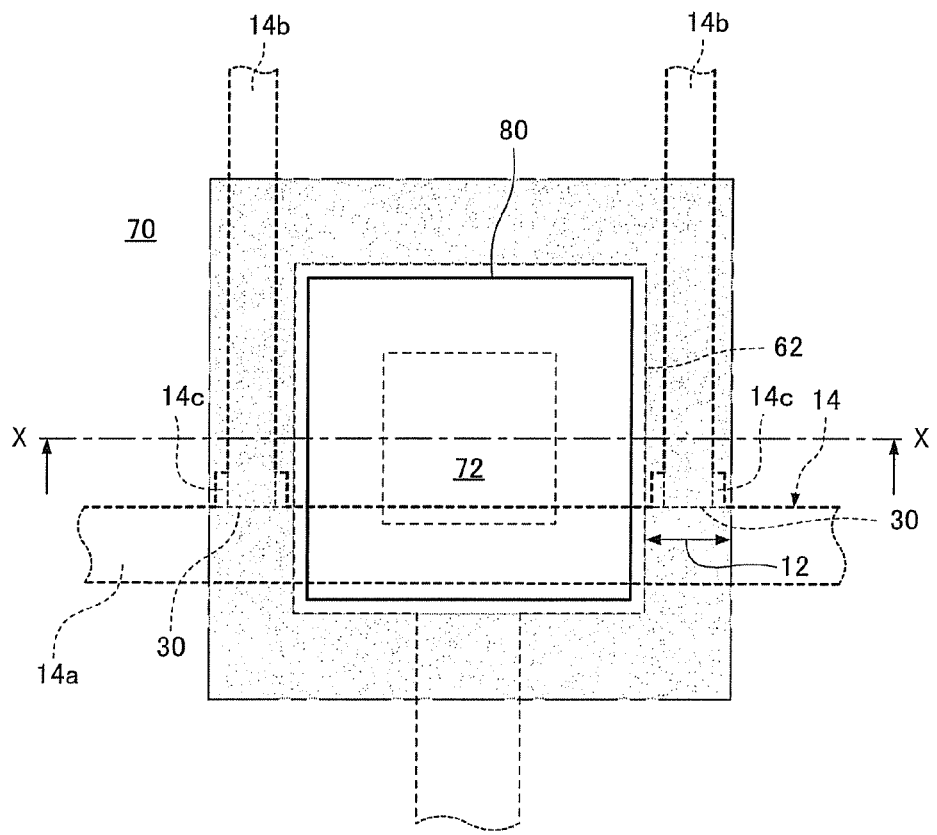
Figure 5:
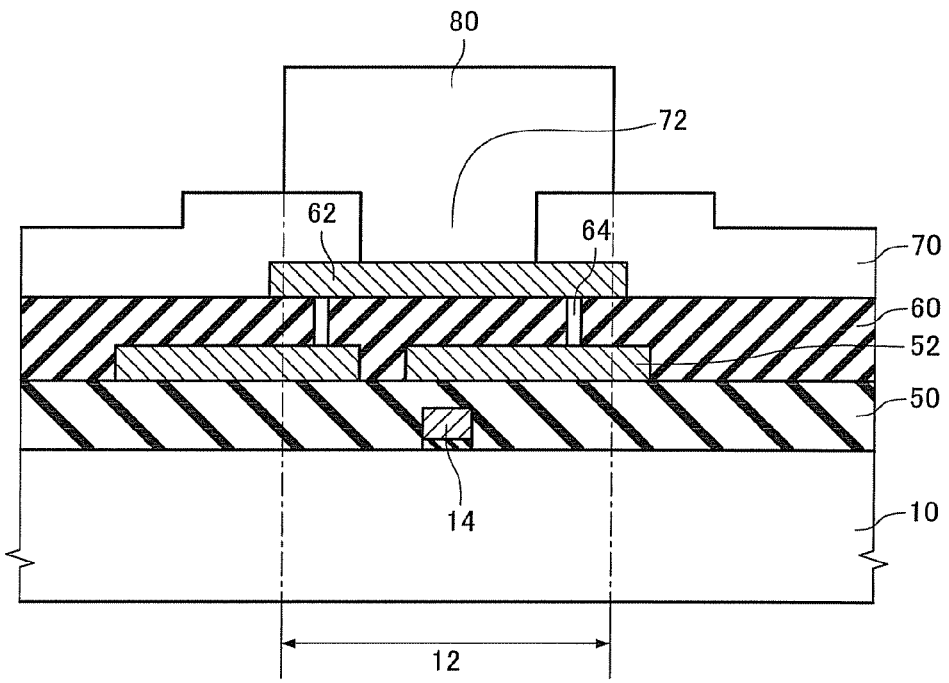
Figure 6:
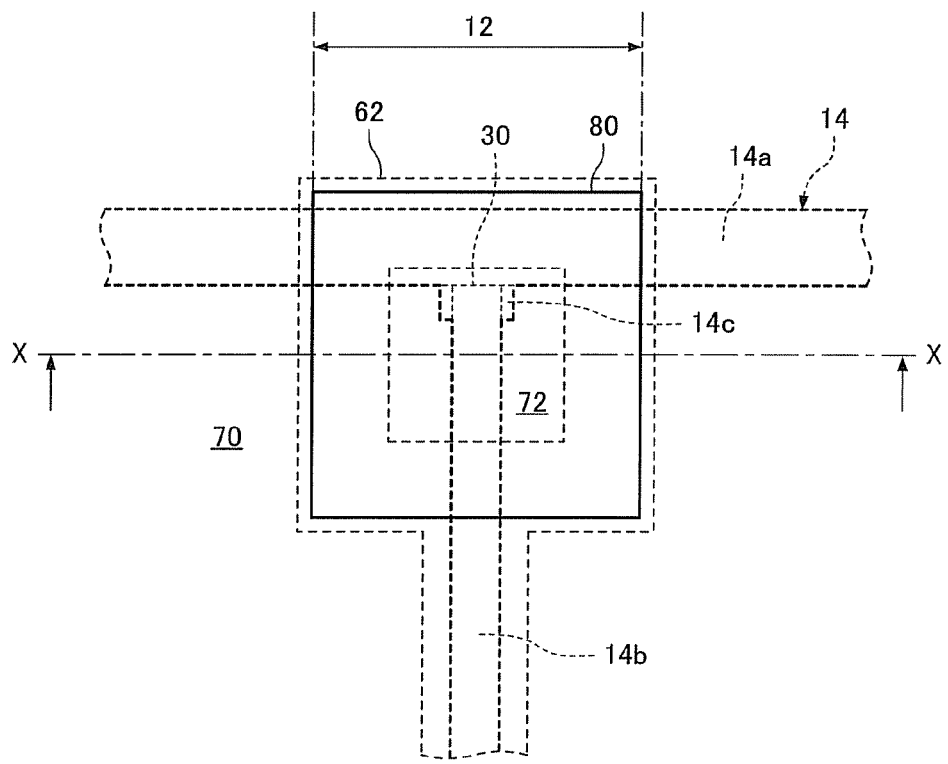
Figure 7:
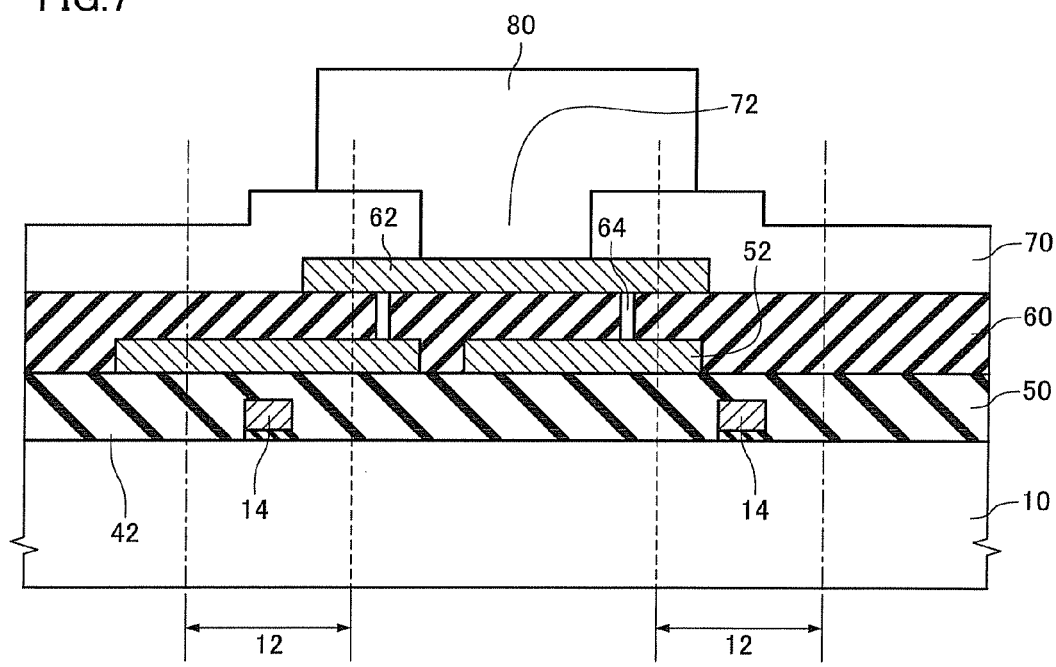
Figure 8:
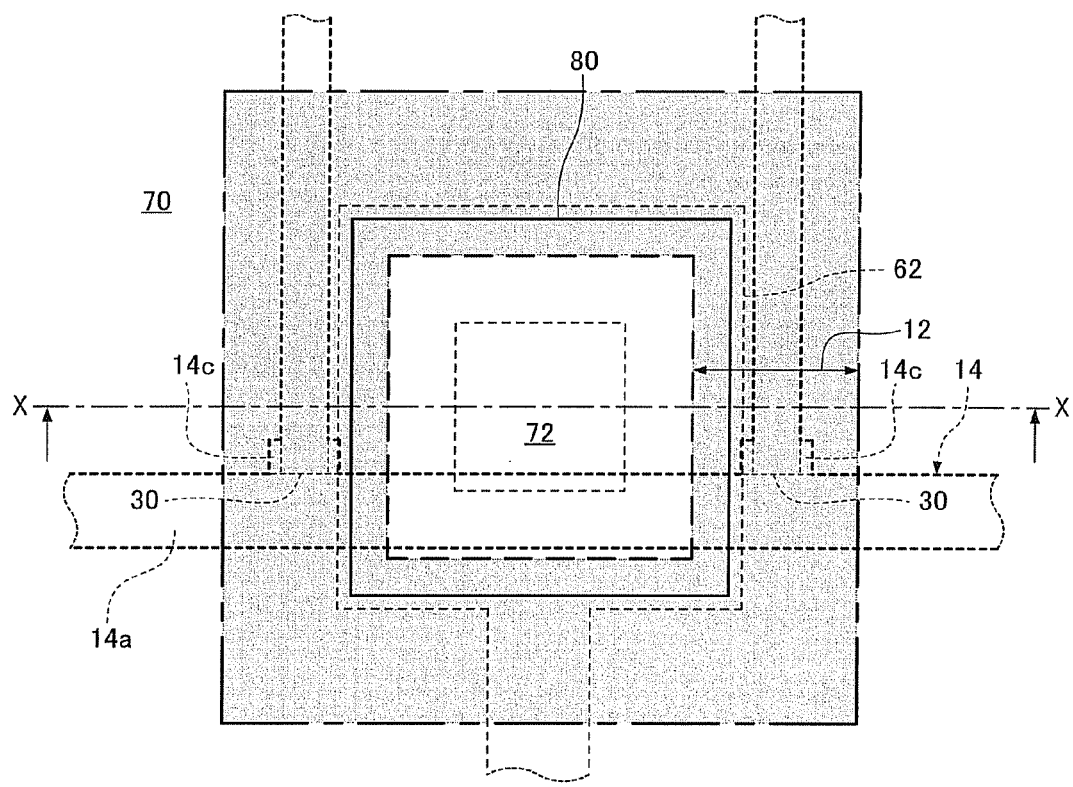
Figure 9A:
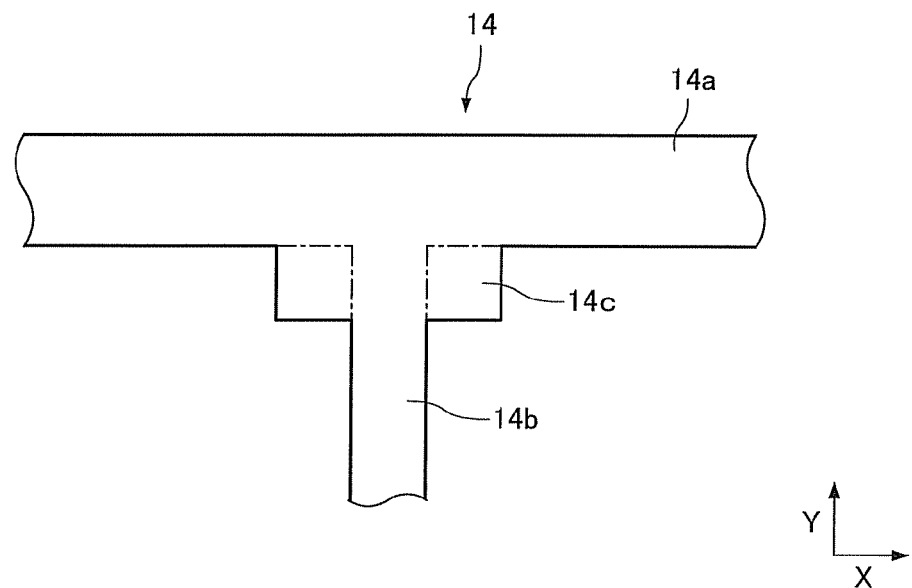
Figure 9B:
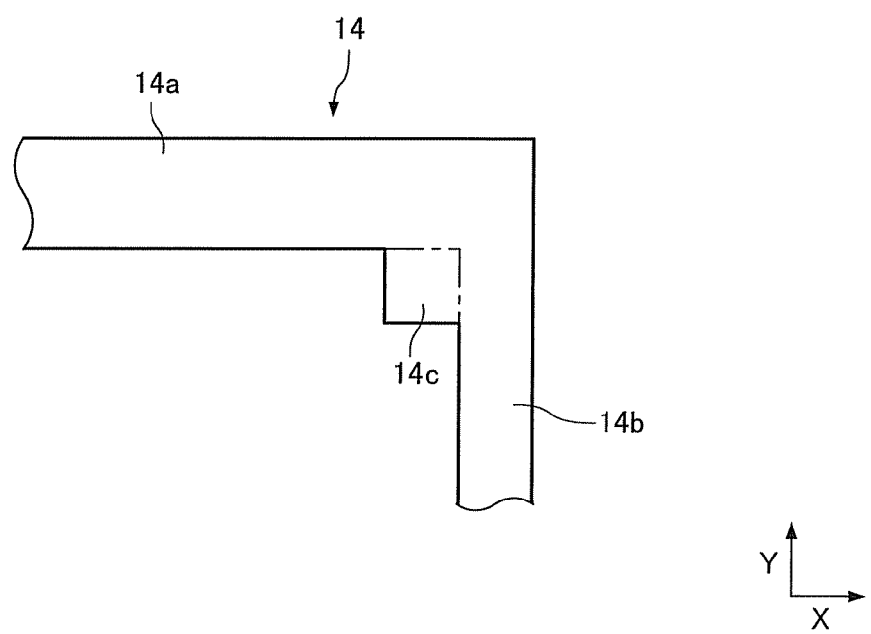
Figure 10A:
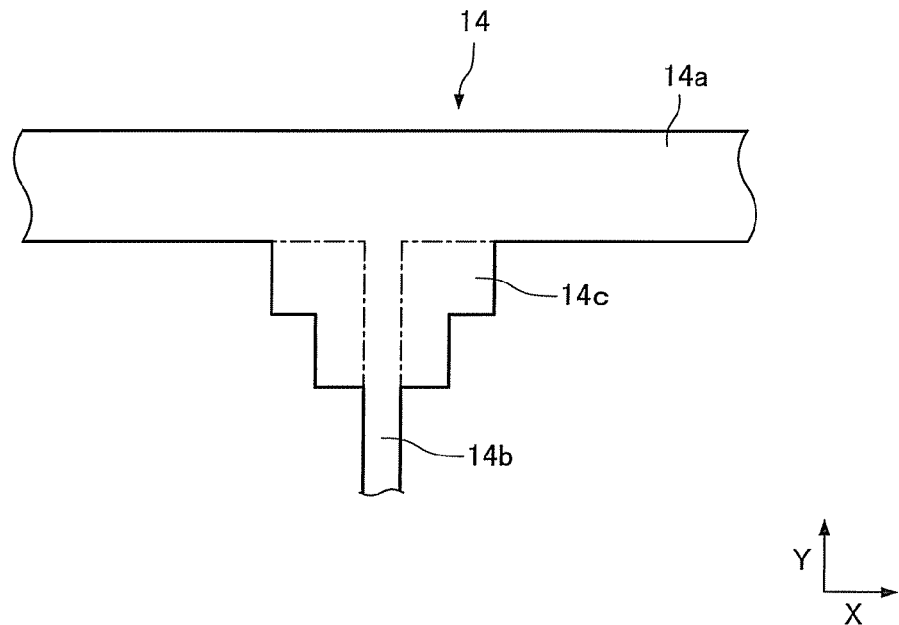
Figure 10B:
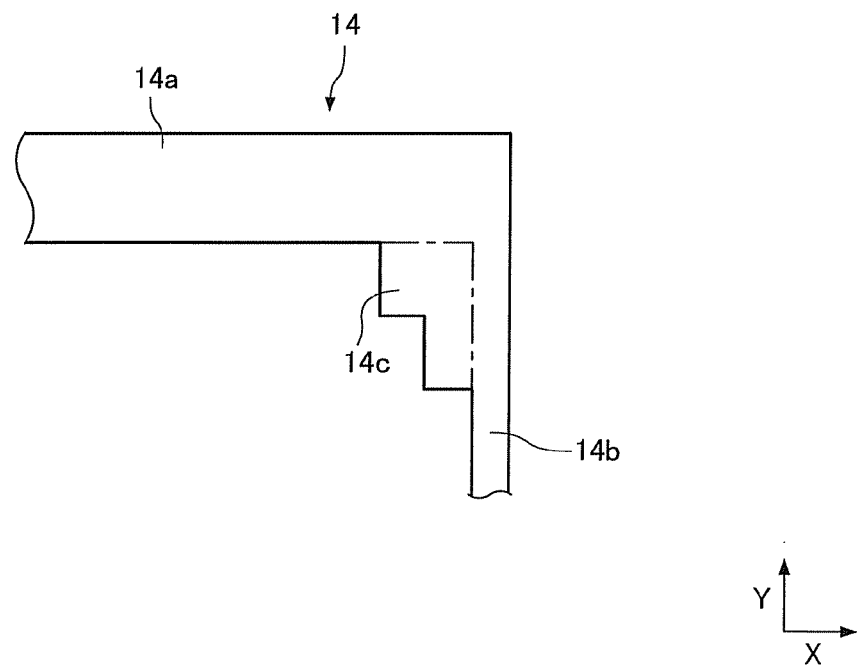
Figure 11A:
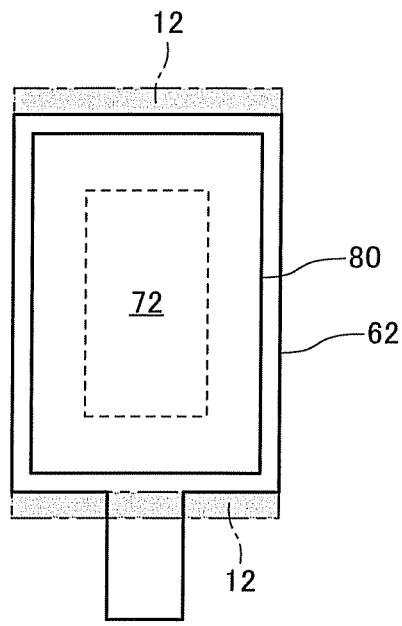
Figure 11B:
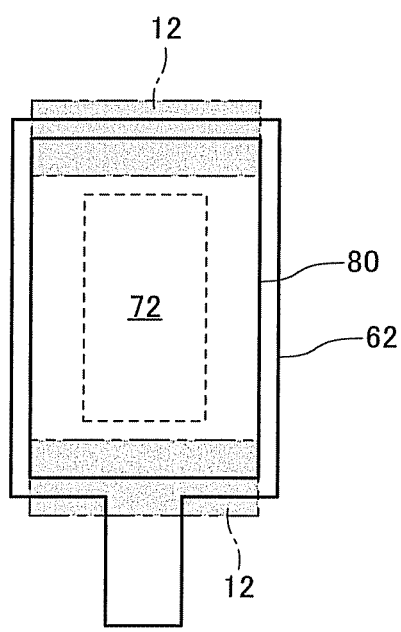
Figure 12:
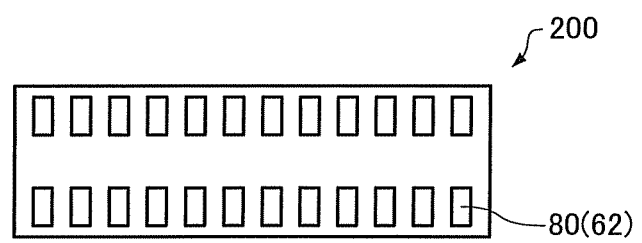

FIG. 1 is a view illustrative of a semiconductor device according to a first embodiment.
FIG. 2 is a view illustrative of a semiconductor device according to the first embodiment.
FIG. 3 is a view illustrative of a semiconductor device according to a second embodiment.
FIG. 4 is a view illustrative of a semiconductor device according to the second embodiment.
FIG. 5 is a view illustrative of a semiconductor device according to a third embodiment.
FIG. 6 is a view illustrative of a semiconductor device according to the third embodiment.
FIG. 7 is a view illustrative of a semiconductor device according to a fourth embodiment.
FIG. 8 is a view illustrative of a semiconductor device according to the fourth embodiment.
FIGS. 9A and 9B are views showing examples of a bent conductive layer in the shape of the letter "T" or "L".
FIGS. 10A and 10B are views showing other examples of a bent conductive layer in the shape of the letter "T" or "L".
FIGS. 11A and 11B are views illustrative of a semiconductor device according to a modification of the second and fourth embodiments.
FIG. 12 is a view illustrative of a semiconductor device according to a modification.

DETAILED DESCRIPTION OF THE EMBODIMENT

The invention may provide a highly reliable semiconductor device in which a conductive layer can be formed under an electrode pad or a bump.

(1) According to one embodiment of the invention, there is provided a semiconductor device, comprising:

a semiconductor layer;

a first conductive layer formed above the semiconductor layer and having a first width;

a second conductive layer connected to the first conductive layer and having a second width which is smaller than the first width;

an interlayer dielectric formed above the first conductive layer and the second conductive layer; and an electrode pad formed above the interlayer dielectric, a connection section at which the first conductive layer and the second conductive layer are connected being disposed in a specific region positioned inward from a line extending vertically downward from an edge of the electrode pad; and a reinforcing section being provided at the connection section.

In the semiconductor device according to this embodiment, stress tends to occur after formation of the electrode pad in the region under the electrode pad. Therefore, cracks tend to occur in the conductive layer having a connection section disposed in this region. In the semiconductor device according to this embodiment, this problem is eliminated by providing the reinforcing section to the conductive layer formed in this region.

In this embodiment, the statement "a specific layer B (hereinafter called "layer B") formed above a specific layer A (hereinafter called "layer A")" includes the case where the layer B is directly formed on the layer A and the case where the layer B is formed on the layer A through another layer.

(2) According to one embodiment of the invention, there is provided a semiconductor device, comprising:

a semiconductor layer;

a first conductive layer formed above the semiconductor layer and having a first width;

a second conductive layer connected to the first conductive layer and having a second width which is smaller than the first width;

an interlayer dielectric formed above the first conductive layer and the second conductive layer; and an electrode pad formed above the interlayer dielectric, a connection section at which the first conductive layer and the second conductive layer are connected being disposed in a specific region positioned outward from a line extending vertically downward from an edge of at least part of the electrode pad; and a reinforcing section being provided at the connection section.

In the semiconductor device according to this embodiment, stress tends to occur after formation of the electrode pad in a specific region positioned outward from a line extending vertically downward from the edge of at least part of the electrode pad. Therefore, cracks tend to occur in the conductive layer having a connection section disposed in this region. In the semiconductor device according to this embodiment, this problem is eliminated by providing the reinforcing section to the conductive layer formed in this region.

(3) In this semiconductor device, the electrode pad may have a rectangular shape having a short side and a long side; and the reinforcing section may be provided at the connection section provided in a specific region positioned outward from a line extending vertically downward from an edge of the short side of the electrode pad.

(4) The semiconductor device may comprise:

a passivation layer formed above the electrode pad and having an opening which exposes at least part of the electrode pad, wherein the specific region is a region having a width corresponding to a thickness of the passivation layer outward from a line extending vertically downward from the edge.

(5) The semiconductor device may comprise:

a passivation layer formed above the electrode pad and having an opening which exposes at least part of the electrode pad, wherein the specific region is a region having a width of 1.0 to 2.5 micrometers outward from a line extending vertically downward from the edge.

(6) The semiconductor device may comprise a bump formed in the opening.

(7) According to one embodiment of the invention, there is provided a semiconductor device, comprising:

a semiconductor layer;

a first conductive layer formed above the semiconductor layer and having a first width;

a second conductive layer connected to the first conductive layer and having a second width which is smaller than the first width;

an interlayer dielectric formed above the first conductive layer and the second conductive layer;

an electrode pad formed above the interlayer dielectric, a passivation layer formed above the electrode pad and having an opening which exposes at least part of the electrode pad; and a bump formed in the opening, a connection section at which the first conductive layer and the second conductive layer are connected being disposed in a specific region positioned inward from a line extending vertically downward from an edge of the bump; and a reinforcing section being provided at the connection section.

In the semiconductor device according to this embodiment, stress tends to occur after formation of the bump in the region under the bump. Therefore, cracks tend to occur in the conductive layer having a connection section disposed in this region. In the semiconductor device according to this embodiment, this problem is eliminated by providing the reinforcing section to the conductive layer formed in this region.

(8) According to one embodiment of the invention, there is provided a semiconductor device, comprising:

a semiconductor layer;

a first conductive layer formed above the semiconductor layer and having a first width;

a second conductive layer connected to the first conductive layer and having a second width which is smaller than the first width;

an interlayer dielectric formed above the first conductive layer and the second conductive layer;

an electrode pad formed above the interlayer dielectric, a passivation layer formed above the electrode pad and having an opening which exposes at least part of the electrode pad; and a bump formed in the opening, a connection section at which the first conductive layer and the second conductive layer are connected being disposed in a specific region positioned inward and outward from a line extending vertically downward from an edge of at least part of the bump; and a reinforcing section being provided at the connection section.

In the semiconductor device according to this embodiment, stress tends to occur after formation of the bump in a specific region positioned inward and outward from a line extending vertically downward from the edge of at least part of the bump. Therefore, cracks tend to occur in the conductive layer disposed in this region. In the semiconductor device according to this embodiment, this problem is eliminated by providing the reinforcing section to the conductive layer formed in this region.

(9) In this semiconductor device,
the bump may have a rectangular shape having a short side and a long side; and
the reinforcing section may be provided at the connection section provided in a specific region positioned inward and outward from a line extending vertically downward from an edge of the short side of the bump.

(10) In this semiconductor device,
the specific region may be a region having a width of 2.0 to 3.0 micrometers outward from a line extending vertically downward from the edge and having a width of 2.0 to 3.0 micrometers inward from a line extending vertically downward from the edge.

(11) In this semiconductor device, the first conductive layer and the second conductive layer may be connected in a shape of the letter "T" or "L".

(12) In this semiconductor device, the reinforcing section may be formed by a third conductive layer protruding from the first conductive layer and the second conductive layer.

(13) In this semiconductor device, the first conductive layer, the second conductive layer, and the third conductive layer may be polysilicon layers.

Some embodiments of the invention will be described in detail below, with reference to the drawings.

1. First Embodiment

FIG. 1 is a cross-sectional view schematically showing a semiconductor device according to a first embodiment of the invention, and FIG. 2 is a plan view schematically showing the relationship between an electrode pad and a conductive layer in the semiconductor device according to the first embodiment. FIG. 1 is a cross-sectional view along the line X-X shown in FIG. 2.

As shown in FIG. 1, the semiconductor device according to the first embodiment includes a semiconductor layer 10. As the semiconductor layer 10, a single crystal silicon substrate, a silicon on insulator (SOI) substrate in which a semiconductor layer is formed on an insulating layer, the semiconductor layer being a silicon layer, a germanium layer, or a silicon germanium layer, or the like may be used.

A conductive layer 14 is formed on the semiconductor layer 10. As shown in FIG. 2, the conductive layer 14 is an interconnect in the shape of the letter "T". In more detail, the conductive layer 14 includes a first conductive layer 14a having a first width, and a second conductive layer 14b connected with the first conductive layer 14a and having a second width smaller than the first width. A reinforcing section 14c is provided at a boundary 30 (hereinafter also called "connection section") at which the first conductive layer 14a and the second conductive layer 14b are connected. As the material for the conductive layer 14, polysilicon, aluminum, an aluminum alloy, or the like may be used. A metal insulator semiconductor (MIS) transistor (not shown) is formed on the semiconductor layer 10. The conductive layer 14 may be electrically connected with the MIS transistor.

An interlayer dielectric 50 provided to cover the conductive layer 14 and an interlayer dielectric 60 are formed over the conductive layer 14 in that order. The interlayer dielectric 50 and the interlayer dielectric 60 may be formed using a known material. An interconnect layer 52 having a specific pattern is formed on the interlayer dielectric 50.

An electrode pad 62 is formed on the interlayer dielectric 60. The electrode pad 62 may be electrically connected with the interconnect layer 52 through a contact layer 64. The electrode pad 62 may be formed of a metal such as aluminum or copper.

As shown in FIG. 1, the semiconductor device according to the first embodiment further includes a passivation layer 70. An opening 72 which exposes at least part of the electrode pad 62 is formed in the passivation layer 70. As shown in FIGS. 1 and 2, the opening 72 may be formed to expose only the center region of the electrode pad 62. Specifically, the passivation layer 70 may be formed to cover the edge portion of the electrode pad 62. The passivation layer may be formed of $SiO_2$, SiN, a polyimide resin, or the like. In the semiconductor device according to the first embodiment, the term "electrode pad" refers to a region which includes the region in which the opening 72 is formed and has a width greater than that of the interconnect section.

In the semiconductor device according to the first embodiment, a bump 80 is formed at least in the opening 72. Specifically, the bump 80 is formed on the exposed surface of the electrode pad 62. In the semiconductor device according to the first embodiment shown in FIG. 1, the bump 80 is also formed on the passivation layer 70. The bump 80 may include one or more layers and may be formed of a metal such as gold, nickel, or copper. The external shape of the bump 80 is not particularly limited. The external shape of the bump 80 may be a quadrilateral (including square and rectangle) or a circle. The external shape of the bump 80 may cover less area than that of the electrode pad 62. In this case, the bump 80 may be formed only in the area in which the bump 80 overlaps the electrode pad 62.

A barrier layer (not shown) may be formed in the lowermost layer of the bump 80. The barrier layer prevents diffusion between the electrode pad 62 and the bump 80. The barrier layer may include one or more layers. The barrier layer may be formed by sputtering. The barrier layer may have a function of increasing the adhesion between the electrode pad 62 and the bump 80. The barrier layer may include a titanium tungsten (TiW) layer. When the barrier layer includes two or more layers, the outermost surface of the barrier layer may be an electroplating feed metal layer (e.g. Au layer) for depositing the bump 80.

A region 12 is described below.

The region 12 is a region within a specific range positioned inward from a line extending vertically downward from the edge of the electrode pad 62. When the connection section 30 of the T-shaped conductive layer 14 is disposed in the region 12, the reinforcing section 14c is provided at the connection section 30.

As shown in FIG. 9A, the T-shaped conductive layer 14 includes the first conductive layer 14a extending in a direction X, the second conductive layer 14b which branches in a direction Y from the first conductive layer 14a, and the reinforcing section 14c formed in the base section of the second conductive layer 14b, for example. The reinforcing section 14c is formed by a conductive layer protruding from the first conductive layer 14a and the second conductive layer 14b. In the T-shaped conductive layer 14, when the second conductive layer 14b which branches from the first conductive layer 14a has a width smaller than the first conductive layer 14a, defects such as cracks tend to occur near the boundary between the first conductive layer 14a and the second conductive layer 14b due to mechanical and thermal stress during mounting. However, such defects are prevented from occurring by providing the reinforcing section 14c. As shown in FIG. 10A, the T-shaped bent conductive layer 14 may include the reinforcing section 14c having a stepwise planar shape. Note that the shape of the reinforcing section 14c is not limited to the above examples. The reinforcing section 14c may have an arbitrary shape insofar as the reinforcement effect for the conductive layer can be achieved.

As shown in FIG. 9B, when the conductive layer 14 is in the shape of the letter "L", the conductive layer 14 includes the first conductive layer 14a extending in the direction X, the second conductive layer 14b extending in the direction Y from the end of the first conductive layer 14a, and the reinforcing section 14c formed in the base section of the second conductive layer 14b. The reinforcing section 14c is formed by a conductive layer protruding from the first conductive layer 14a and the second conductive layer 14b. In the L-shaped bent conductive layer 14, when the second conductive layer 14b has a width smaller than the first conductive layer 14a, defects such as cracks tend to occur near the boundary between the first conductive layer 14a and the second conductive layer 14b due to mechanical and thermal stress during mounting. However, such defects are prevented from occurring by providing the reinforcing section 14c. As shown in FIG. 10B, the L-shaped bent conductive layer 14 may include the reinforcing section 14c having a stepwise shape. Note that the shape of the reinforcing section 14c is not limited to the above examples. The reinforcing section 14c may have an arbitrary shape insofar as the reinforcement effect can be achieved.

The region 12 may be the region inward from a line extending vertically downward from the edge of the electrode pad 62. The range of the region 12 is specified as described above for the following reasons.

When the electrode pad 62 is formed, stress occurs in the interlayer dielectric 60 at a position in which the edge of the electrode pad 62 is positioned. When the bump 80 is formed on the electrode pad 62, a continuous stress additionally occurs due to the internal stress of the bump 80. The stress may cause cracks to occur in the interlayer dielectrics 50 and 60 from the position (edge of the electrode pad 62) at which the stress occurs. Such cracks may reach the lowermost interlayer dielectric. For example, when a conductive layer is formed in such a region, defects such as cracks may occur in the conductive layer.

The range of the region 12 is not limited to the first layer, but may be applied to a conductive layer formed in the second or higher layer, for example.

As described above, the semiconductor device according to the first embodiment allows the T-shaped or L-shaped bent conductive layer exhibiting mechanical strength to be formed as the conductive layer in the region 12, whereby the degrees of freedom of the wiring pattern design can be increased.

2. Second Embodiment

FIG. 3 is a cross-sectional view schematically showing a semiconductor device according to a second embodiment of the invention, and FIG. 4 is a plan view schematically showing the relationship between an electrode pad and a conductive layer in the semiconductor device according to the second embodiment. FIG. 3 is a cross-sectional view along the line X-X shown in FIG. 4.

The second embodiment differs from the first embodiment as to the position of the region 12. Note that members substantially the same as the members of the semiconductor device according to the first embodiment are assigned the same symbols. Detailed description of these members is omitted.

As shown in FIG. 3, the semiconductor device according to the second embodiment includes the semiconductor layer 10. The conductive layer 14 is formed on the semiconductor layer 10. As shown in FIG. 4, the conductive layer 14 is an interconnect in the shape of the letter "T". In more detail, the conductive layer 14 includes the first conductive layer 14a having the first width, and the second conductive layer 14b connected with the first conductive layer 14a and having the second width smaller than the first width. The reinforcing section 14c is provided at the boundary 30 (hereinafter also called "connection section") at which the first conductive layer 14a and the second conductive layer 14b are connected. As the material for the conductive layer 14, polysilicon, aluminum, an aluminum alloy, or the like may be used. A metal insulator semiconductor (MIS) transistor (not shown) is formed on the semiconductor layer 10. The conductive layer 14 may be electrically connected with the MIS transistor.

The interlayer dielectric 50 provided to cover the conductive layer 14 and the interlayer dielectric 60 are formed over the conductive layer 14 in that order. The interlayer dielectric 50 and the interlayer dielectric 60 may be formed using a known material. The interconnect layer 52 having a specific pattern is formed on the interlayer dielectric 50. The electrode pad 62 is formed on the interlayer dielectric 60. The electrode pad 62 may be electrically connected with the interconnect layer 52 through the contact layer 64.

As shown in FIG. 3, the semiconductor device according to the first embodiment further includes the passivation layer 70. The opening 72 which exposes at least part of the electrode pad 62 is formed in the passivation layer 70.

In the semiconductor device according to the first embodiment, the bump 80 is formed at least in the opening 72. Specifically, the bump 80 is formed on the exposed surface of the electrode pad 62. The bump 80 is formed to reach the portion on the passivation layer 70.

The region 12 is described below.

The region 12 is a region within a specific range positioned outward from a line extending vertically downward from the edge of the electrode pad 62.

When the connection section 30 of the T-shaped conductive layer 14 is disposed in the region 12, the reinforcing section 14c is provided at the connection section 30.

The conductive layer 14 may be in the shape of the letter "T" or "L" similar to that described in the first embodiment. Since the conductive layer 14 includes the reinforcing section 14c, defects such as cracks due to mechanical and thermal stress during mounting rarely occur near the boundary between the first conductive layer 14a and the second conductive layer 14b.

The region 12 may be the range having a width corresponding to the thickness of the passivation layer 70 outward (in the direction away from the opening 72) from a line extending vertically downward from the edge of the electrode pad 62. For example, the region 12 may be the range having a width of 1.0 to 2.5 micrometers outward from the edge of the electrode pad 62. The range of the region 12 is specified as described above for the following reasons.

When the electrode pad 62 is formed, stress occurs in the interlayer dielectric 60 at a position in which the edge of the electrode pad 62 is positioned. When the bump 80 is formed on the electrode pad 62, a continuous stress additionally occurs due to the internal stress of the bump 80. The stress may cause cracks to occur in the interlayer dielectrics 50 and 60 from the position (edge of the electrode pad 62) at which the stress occurs. Such cracks may reach the lowermost interlayer dielectric. For example, when a conductive layer is formed in such a region, defects such as cracks may occur in the conductive layer.

The passivation layer 70 is not formed on a surface having a uniform height. That is, the passivation layer 70 may have a surface having a level difference corresponding to the shape of the electrode pad 62. For example, when mounting the semiconductor device by a chip-on-film (COF) method, stress due to contact and bonding tends to be concentrated in the region in which the level difference is formed when connecting the bump 80 through a connection line (lead wire) formed on a film. This may also cause cracks to occur in the interlayer dielectrics 50 and 60. The level difference is generally formed in the area having a width approximately corresponding to the thickness of the passivation layer 70 outward from the edge of the electrode pad 62. The range of the region 12 may be specified taking these problems into consideration.

The range of the region 12 is not limited to the first layer, but may be applied to a conductive layer formed in the second or higher layer, for example. The region 12 may be the region within a specific range positioned outward from a line extending vertically downward from the edge of at least part of the electrode pad 62.

As described above, the semiconductor device according to the second embodiment allows the T-shaped or L-shaped bent conductive layer exhibiting mechanical strength to be formed as the conductive layer in the region 12, whereby the degrees of freedom of the wiring pattern design can be increased.

3. Third Embodiment

FIG. 5 is a cross-sectional view schematically showing a semiconductor device according to a third embodiment of the invention, and FIG. 6 is a plan view schematically showing the relationship between a bump and a conductive layer in the semiconductor device according to the third embodiment. FIG. 5 is a cross-sectional view along the line X-X shown in FIG. 6.

The third embodiment differs from the first and second embodiments as to the position of the region 12. Note that members substantially the same as the members of the semiconductor device according to the first embodiment are assigned the same symbols. Detailed description of these members is omitted.

As shown in FIG. 5, the semiconductor device according to the third embodiment includes the semiconductor layer 10. The conductive layer 14 is formed on the semiconductor layer 10. As shown in FIG. 6, the conductive layer 14 is an interconnect in the shape of the letter "T". In more detail, the conductive layer 14 includes the first conductive layer 14a having the first width, and the second conductive layer 14b connected with the first conductive layer 14a and having the second width smaller than the first width. The reinforcing section 14c is provided at the boundary 30 (hereinafter also called "connection section") at which the first conductive layer 14a and the second conductive layer 14b are connected. As the material for the conductive layer 14, polysilicon, aluminum, an aluminum alloy, or the like may be used. A metal insulator semiconductor (MIS) transistor (not shown) is formed on the semiconductor layer 10. The conductive layer 14 may be electrically connected with the MIS transistor.

The interlayer dielectric 50 provided to cover the conductive layer 14 and the interlayer dielectric 60 are formed over the conductive layer 14 in that order. The interlayer dielectric 50 and the interlayer dielectric 60 may be formed using a known material. The interconnect layer 52 having a specific pattern is formed on the interlayer dielectric 50. The electrode pad 62 is formed on the interlayer dielectric 60. The electrode pad 62 may be electrically connected with the interconnect layer 52 through the contact layer 64.

As shown in FIG. 5, the semiconductor device according to the first embodiment further includes the passivation layer 70. The opening 72 which exposes at least part of the electrode pad 62 is formed in the passivation layer 70.

In the semiconductor device according to the first embodiment, the bump 80 is formed at least in the opening 72. Specifically, the bump 80 is formed on the exposed surface of the electrode pad 62. In the semiconductor device according to the first embodiment shown in FIG. 1, the bump 80 is also formed on the passivation layer 70.

The region 12 is described below.

The region 12 is a region within a specific range positioned inward from a line extending vertically downward from the edge of the bump 80.

When the connection section 30 of the T-shaped conductive layer 14 is disposed in the region 12, the reinforcing section 14c is provided at the connection section 30.

The conductive layer 14 may be in the shape of the letter "T" or "L" similar to that described in the first embodiment. Since the conductive layer 14 includes the reinforcing section 14c, defects such as cracks due to mechanical and thermal stress during mounting rarely occur near the boundary between the first conductive layer 14a and the second conductive layer 14b.

The region 12 may be the region inward from a line extending vertically downward from the edge of the bump 80. The range of the region 12 is specified as described above for the following reasons.

When the electrode pad 62 is formed, stress occurs in the interlayer dielectric 60 at a position at which the edge of the electrode pad 62 is positioned. When the bump 80 is formed on the electrode pad 62, as shown in FIG. 5, a continuous stress additionally occurs due to the internal stress of the bump 80. The stress may cause cracks to occur in the interlayer dielectrics 50 and 60 from the position (edge of the electrode pad 62) at which the stress occurs. Such cracks may reach the lowermost interlayer dielectric. For example, when a conductive layer is formed in such a region, defects such as cracks may occur in the conductive layer.

The range of the region 12 is not limited to the first layer, but may be applied to a conductive layer formed in the second or higher layer, for example. The region 12 may be the region within a specific range positioned outward from a line extending vertically downward from the edge of at least part of the electrode pad 62.

As described above, the semiconductor device according to the third embodiment allows the T-shaped or L-shaped bent conductive layer exhibiting mechanical strength to be formed as the conductive layer in the region 12, whereby the degrees of freedom of the wiring pattern design can be increased.

4. Fourth Embodiment

FIG. 7 is a cross-sectional view schematically showing a semiconductor device according to a fourth embodiment of the invention, and FIG. 8 is a plan view schematically showing the relationship between a bump and a conductive layer in the semiconductor device according to the fourth embodiment. FIG. 7 is a cross-sectional view along the line X-X shown in FIG. 8.

The fourth embodiment differs from the first to third embodiments as to the position of the region 12. Note that members substantially the same as the members of the semiconductor device according to the first embodiment are assigned the same symbols. Detailed description of these members is omitted.

As shown in FIG. 7, the semiconductor device according to the fourth embodiment includes the semiconductor layer 10. The conductive layer 14 is formed on the semiconductor layer 10. As shown in FIG. 8, the conductive layer 14 is an interconnect in the shape of the letter "T". In more detail, the conductive layer 14 includes the first conductive layer 14a having the first width, and the second conductive layer 14b connected with the first conductive layer 14a and having the second width smaller than the first width. The reinforcing section 14c is provided at the boundary 30 (hereinafter also called "connection section") at which the first conductive layer 14a and the second conductive layer 14b are connected. As the material for the conductive layer 14, polysilicon, aluminum, an aluminum alloy, or the like may be used. A metal insulator semiconductor (MIS) transistor (not shown) is formed on the semiconductor layer 10. The conductive layer 14 may be electrically connected with the MIS transistor.

The interlayer dielectric 50 provided to cover the conductive layer 14 and the interlayer dielectric 60 are formed over the conductive layer 14 in that order. The interlayer dielectric 50 and the interlayer dielectric 60 may be formed using a known material. The interconnect layer 52 having a specific pattern is formed on the interlayer dielectric 50. The electrode pad 62 is formed on the interlayer dielectric 60. The electrode pad 62 may be electrically connected with the interconnect layer 52 through the contact layer 64.

As shown in FIG. 7, the semiconductor device according to the fourth embodiment further includes the passivation layer 70. The opening 72 which exposes at least part of the electrode pad 62 is formed in the passivation layer 70.

In the semiconductor device according to the first embodiment, the bump 80 is formed at least in the opening 72. Specifically, the bump 80 is formed on the exposed surface of the electrode pad 62. In the semiconductor device according to the first embodiment shown in FIG. 1, the bump 80 is also formed on the passivation layer 70.

The region 12 is described below.

The region 12 is a region within a specific range positioned inward and outward from a line extending vertically downward from the edge of the bump 80.

When the connection section 30 of the T-shaped conductive layer 14 is disposed in the region 12, the reinforcing section 14c is provided at the connection section 30.

The conductive layer 14 may be in the shape of the letter "T" or "L" similar to that described in the first embodiment. Since the conductive layer 14 includes the reinforcing section 14c, defects such as cracks due to mechanical and thermal stress during mounting rarely occur near the boundary between the first conductive layer 14a and the second conductive layer 14b.

The region 12 may be the range having a width of 2.0 to 3.0 micrometers outward (in the direction away from the opening 72) from a line extending vertically downward from the edge of the bump 80 and having a width of 2.0 to 3.0 micrometers inward (in the direction toward the opening 72) from the a line extending vertically downward from the edge of the bump 80. The range of the region 12 is specified as described above for the following reasons.

Stress occurs near the edge of the bump 80 during the formation process of the bump 80. After the bump 80 has been formed, stress continuously occurs near the edge of the bump 80 due to the internal stress of the bump 80. The stress may cause cracks to occur in the interlayer dielectrics 50 and 60 from the position at which the stress occurs. Such cracks may reach the lowermost interlayer dielectric, whereby defects such as cracks may occur in the conductive layer formed in such a region.

The range of the region 12 is not limited to the first layer, but may be applied to a conductive layer formed in the second or higher layer, for example. The region 12 may be the region within a specific range positioned outward from a line extending vertically downward from the edge of at least part of the electrode pad 62.

As described above, the semiconductor device according to the fourth embodiment allows the T-shaped or L-shaped bent conductive layer exhibiting mechanical strength to be formed as the conductive layer in the region 12, whereby the degrees of freedom of the wiring pattern design can be increased.

5. Modification

A modification of the semiconductor devices according to the second embodiment and the fourth embodiment is described below with reference to FIGS. 11A and 11B. This modification is characterized in that the electrode pad 62 and the bump 80 have a rectangular shape. FIGS. 11A and 11B are plan views schematically showing the positional relationship among the bump 80, the electrode pad 62, and the region 12. The following description merely illustrates the difference from the semiconductor devices according to the second embodiment and the fourth embodiment.

In the semiconductor device according to this modification, the bump 80 is formed in the opening 72 on the electrode pad 62, as shown in FIGS. 3 and 7. In this modification, the electrode pad 62 has a rectangular shape. The opening 72 is formed on part of the upper surface of the electrode pad 62, and the bump 80 is formed in the opening 72. The bump 80 has a planar shape smaller in area than that of the electrode pad 62. As shown in FIGS. 11A and 11B, it is preferable that the bump 80 be provided inside the electrode pad 62 when viewed from the top side.

A first modification is a modification relating to the second embodiment. In this modification, the region 12 is provided in the region positioned outward from a line extending vertically downward from the edge of the short side of the electrode pad 62, as shown in FIG. 11A. This configuration has the following advantage when mounting the semiconductor device by tape automated bonding (TAB) technology provided that the extension direction of a connection line (lead wire) formed on a film made of a polyimide resin or the like is the direction along the long side of the electrode pad 62. In this case, the electrode pad 62 is pulled in the extension direction of the connection line, whereby stress occurs on the short side of the electrode pad 62. Therefore, cracks tend to occur in the interlayer dielectrics 50 and 60 on the edge on the short side of the electrode pad 62. This modification reliably prevents the semiconductor element from being formed at a position in which the reliability is decreased by providing the region 12 on the short side of the electrode pad 62.

A second modification is a modification relating to the fourth embodiment. In this modification, the region 12 is provided in the region positioned inward and outward from a line extending vertically downward from the edge of the short side of the bump 80, as shown in FIG. 11B.

In particular, in a semiconductor chip 200 which is scaled down as shown in FIG. 12, a structure may be required in which the opening 72 and the bump 80 are formed in a rectangular planar shape to provide a number of openings 72. According to this modification, a semiconductor device which is scaled down and provided with improved reliability can be provided by providing the region 12 in an appropriate region of the semiconductor device having such rectangular electrode pads 62 (bumps 80).

The above embodiments illustrate the case where two interlayer dielectrics 50 and 60 are provided and one interconnect layer 52 is provided between the interlayer dielectrics 50 and 60. Note that the above embodiments are not limited thereto. A structure may also be employed in which three or more interlayer dielectrics are stacked and interconnect layers in a number corresponding to the number of interlayer dielectrics are provided.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device, comprising:
   a semiconductor layer;
   a first conductive layer formed above the semiconductor layer and having a first width;
   a second conductive layer connected to the first conductive layer and having a second width which is smaller than the first width;
   an interlayer dielectric formed above the first conductive layer and the second conductive layer;
   an electrode pad formed above the interlayer dielectric;
   at least one connection section at which the first conductive layer and the second conductive layer are connected in a shape of the letter "T" or "L" in plan view, wherein all of the connection sections being disposed in a specific region positioned outward from a line extending vertically downward from a first edge that is an outer edge of the electrode pad;
   a reinforcing section being provided at the connection section;
   a passivation layer formed above the electrode pad and having an opening which exposes at least part of the electrode pad,
   wherein the passivation layer has a first upper surface and a second upper surface;
   wherein part of the second upper surface overlaps with part of the electrode pad, and the height of the second upper surface is higher than the height of the first upper surface;
   wherein a level difference between the first upper surface and the second upper surface corresponds to the shape of the electrode pad; a second edge of the second upper surface being formed at the location of the level difference; and
   wherein the specific region is positioned between the line extending vertically downward from the first edge and a line extending vertically downward from the second edge.

2. The semiconductor device as defined in claim 1,
   wherein the electrode pad has a rectangular shape having a short side and a long side;
   wherein the edge is a first edge of the short side of the electrode pad;
   wherein the specific region is a first specific region positioned outward from a line extending vertically downward from the first edge; and
   wherein the reinforcing section is provided at the connection section provided in the specific region positioned outward from the line extending vertically downward from the edge of the short side of the electrode pad.

3. The semiconductor device as defined in claim 1, comprising a bump formed in the opening.

4. The semiconductor device as defined in claim 1, comprising:
   a passivation layer formed above the electrode pad and having an opening which exposes at least part of the electrode pad,
   wherein the specific region is a region having a width of 1.0 to 2.5 micrometers outward from a line extending vertically downward from the edge.

5. The semiconductor device as defined in claim 1,
   wherein the reinforcing section is formed by a third conductive layer protruding from the first conductive layer and the second conductive layer.

6. The semiconductor device as defined in claim 5,
   wherein the first conductive layer, the second conductive layer, and the third conductive layer are polysilicon layers.

* * * * *